United States Patent
Schwandner et al.

(10) Patent No.: US 8,685,270 B2
(45) Date of Patent: Apr. 1, 2014

(54) METHOD FOR PRODUCING A SEMICONDUCTOR WAFER

(75) Inventors: Juergen Schwandner, Garching (DE); Thomas Buschhardt, Burghausen (DE); Diego Feijoo, Bughausen (DE); Michael Kerstan, Burghausen (DE); Georg Pietsch, Burghausen (DE); Guenter Schwab, Neuoetting (DE)

(73) Assignee: Siltronic AG, Munich (DE)

( * ) Notice: Subject to any disclaimer, the term of this patent is extended or adjusted under 35 U.S.C. 154(b) by 64 days.

(21) Appl. No.: 12/902,558

(22) Filed: Oct. 12, 2010

(65) Prior Publication Data

US 2011/0097975 A1    Apr. 28, 2011

(30) Foreign Application Priority Data

Oct. 28, 2009  (DE) .......................... 10 2009 051 008

(51) Int. Cl.
  *C03C 15/00* (2006.01)
  *C03C 25/68* (2006.01)
  *B44C 1/22* (2006.01)
  *H01L 21/302* (2006.01)
  *H01L 21/461* (2006.01)

(52) U.S. Cl.
  USPC .............................. 216/88; 438/691; 438/692

(58) Field of Classification Search
  USPC .......................................................... 216/88
  See application file for complete search history.

(56) References Cited

U.S. PATENT DOCUMENTS

| 3,905,162 A | 9/1975 | Lawrence et al. |
|---|---|---|
| 4,655,191 A | 4/1987 | Wells et al. |
| 5,287,774 A | 2/1994 | Seifert |
| 5,400,548 A | 3/1995 | Huber et al. |
| 5,658,189 A | 8/1997 | Kagamida |
| 5,942,445 A | 8/1999 | Kato et al. |
| 5,989,105 A | 11/1999 | Kawaguchi et al. |
| 6,007,407 A | 12/1999 | Rutherford et al. |
| 6,066,565 A * | 5/2000 | Kuroki et al. ................. 438/692 |
| 6,220,928 B1 | 4/2001 | Okabe et al. |
| 6,299,514 B1 | 10/2001 | Boller |
| 6,599,177 B2 | 7/2003 | Nevoret et al. |

(Continued)

FOREIGN PATENT DOCUMENTS

| CN | 1546283 A | 11/2004 |
|---|---|---|
| CN | 1746255 A | 3/2006 |

(Continued)

*Primary Examiner* — Binh X Tran
*Assistant Examiner* — Thomas Pham
(74) *Attorney, Agent, or Firm* — Leydig, Voit & Mayer, Ltd.

(57) ABSTRACT

A method for producing a semiconductor wafer sliced from a single crystal includes rounding an edge using a grinding disk containing abrasives with an average grain size of 20.0-60.0 μm. A first simultaneous double-side material-removing process is performed wherein the semiconductor wafers are processed between two rotating ring-shaped working disks, each working disk having a working layer containing abrasives having an average grain size of 5.0-20.0 μm, wherein the semiconductor wafer is placed in a cutout in one of a plurality of carriers rotatable by a rolling apparatus such that the semiconductor wafer lies in a freely movable manner in the carrier and the wafer is movable on a cycloidal trajectory. A second simultaneous double-side material-removing process is performed including processing the semiconductor wafers between two rotating ring-shaped working disks, each working disk having a working layer containing abrasives having an average grain size of 0.5-15.0 μm.

10 Claims, 1 Drawing Sheet

(56) References Cited

U.S. PATENT DOCUMENTS

| | | |
|---|---|---|
| 6,602,117 B1 | 8/2003 | Chopra et al. |
| 7,077,726 B2 | 7/2006 | Pietsch et al. |
| 7,589,023 B2 | 9/2009 | Taniguchi et al. |
| 7,754,009 B2 | 7/2010 | Hensel et al. |
| 7,815,489 B2 | 10/2010 | Pietsch et al. |
| 8,113,913 B2 | 2/2012 | Pietsch et al. |
| 2002/0077039 A1* | 6/2002 | Wenski et al. ................. 451/41 |
| 2003/0010469 A1 | 1/2003 | Tiemann |
| 2003/0060050 A1* | 3/2003 | Pietsch et al. ................. 438/692 |
| 2003/0104698 A1* | 6/2003 | Taniguchi et al. ............ 438/692 |
| 2004/0065022 A1 | 4/2004 | Machii et al. |
| 2005/0227590 A1 | 10/2005 | Sung |
| 2007/0072423 A1 | 3/2007 | Hensel et al. |
| 2007/0259531 A1 | 11/2007 | Stadler et al. |
| 2007/0264911 A1* | 11/2007 | Mattes et al. ................. 451/41 |
| 2008/0004743 A1* | 1/2008 | Goers et al. .................. 700/121 |
| 2008/0014839 A1 | 1/2008 | Pietsch et al. |
| 2008/0113510 A1* | 5/2008 | Kato et al. ................... 438/691 |
| 2008/0233840 A1* | 9/2008 | Pietsch et al. ................. 451/41 |
| 2008/0287038 A1* | 11/2008 | Miyabe et al. ................. 451/36 |
| 2008/0305722 A1 | 12/2008 | Roettger et al. |
| 2009/0029552 A1 | 1/2009 | Schwandner et al. |
| 2009/0130960 A1 | 5/2009 | Roettger et al. |
| 2009/0324896 A1 | 12/2009 | Kato |
| 2010/0237474 A1 | 9/2010 | Hensel et al. |
| 2011/0081836 A1 | 4/2011 | Schwandner |

FOREIGN PATENT DOCUMENTS

| | | |
|---|---|---|
| DE | 3942671 A1 | 6/1991 |
| DE | 19535616 A1 | 4/1996 |
| DE | 19841473 A1 | 3/2000 |
| DE | 10007390 A1 | 10/2000 |
| DE | 10196115 T1 | 5/2003 |
| DE | 10344602 A1 | 5/2005 |
| DE | 102005046726 A1 | 3/2006 |
| DE | 102006032455 A1 | 4/2008 |
| DE | 102006048218 A1 | 4/2008 |
| DE | 102007035266 A1 | 1/2009 |
| DE | 102007056122 A1 | 5/2009 |
| DE | 102009048436 A1 | 4/2011 |
| EP | 0433956 A1 | 6/1991 |
| EP | 0522542 A1 | 1/1993 |
| EP | 0955126 A2 | 11/1999 |
| EP | 2107598 A1 | 10/2009 |
| JP | 58168243 A | 10/1983 |
| JP | 2002231669 A | 8/2002 |
| JP | 2002299290 A | 10/2002 |
| JP | 2003045836 A | 2/2003 |
| JP | 2003142434 | 5/2003 |
| JP | 2006120939 A | 5/2006 |
| JP | 2007300127 A | 11/2007 |
| KR | 20030019144 A | 3/2003 |
| KR | 20090094060 A | 9/2009 |
| WO | 9213680 A1 | 8/1992 |
| WO | 9955491 A1 | 11/1999 |

* cited by examiner

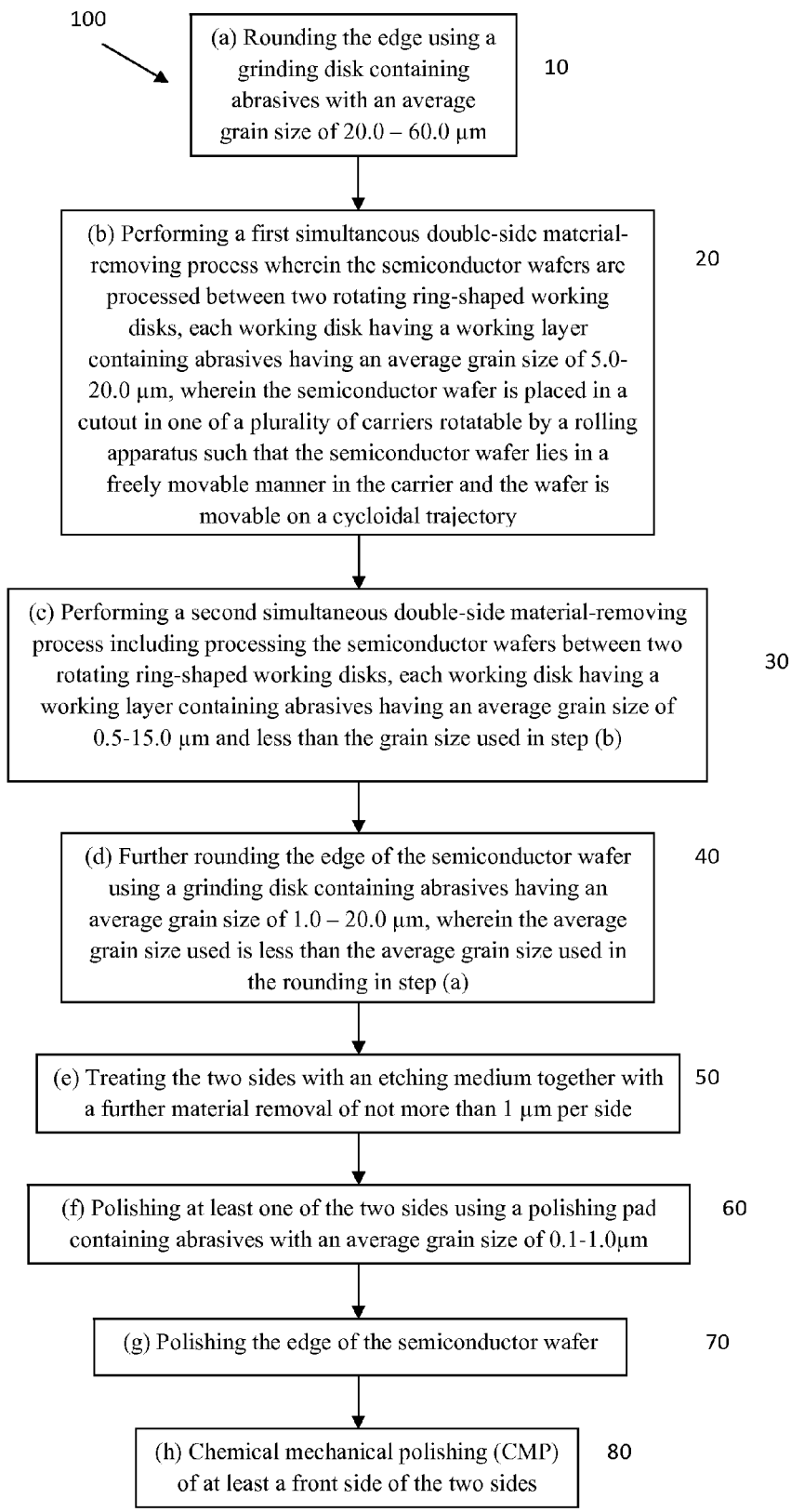

METHOD FOR PRODUCING A SEMICONDUCTOR WAFER

CROSS REFERENCE TO PRIOR APPLICATIONS

Priority is claimed to German Application No. DE 10 2009 051 008.7, filed Oct. 28, 2009, the entire disclosure of which is incorporated by reference herein.

FIELD

The invention relates to a method for producing a semiconductor wafer.

BACKGROUND

In accordance with the prior art, semiconductor wafers are produced in a multiplicity of successive process steps, which can generally be subdivided into the following groups:

a) production of a single crystal composed of semiconductor material (crystal pulling);

b) separation of the semiconductor single crystal into individual wafers ("wafering", "sawing"), c) mechanical processing of the semiconductor wafers;

d) chemical processing of the semiconductor wafers;

e) chemomechanical processing of the semiconductor wafers;

f) thermal treatment of the semiconductor wafers and/or epitaxial coating of the semiconductor wafers.

In addition there are a multiplicity of secondary steps such as cleaning, measuring and packaging.

A semiconductor single crystal is usually produced by pulling a single crystal from a melt (CZ or "Czochralski" method) or by recrystallizing a rod composed of polycrystalline semiconductor material (FZ or "floating zone" method).

Known separation methods include wire sawing ("multi-wire slicing", MWS) and internal-diameter sawing.

In the case of wire sawing, a multiplicity of semiconductor wafers are sliced from a piece of crystal in one work operation.

The mechanical processing serves for removing sawing undulations, for removing the surface layers that were damaged in crystalline fashion by the rougher sawing processes or were contaminated by the sawing wire, and primarily for global leveling of the semiconductor wafers. Surface grinding (single-side, double-side) and lapping are known here, and also mechanical edge processing steps.

In the case of single-side grinding, the semiconductor wafer is held on the rear side on a support ("chuck") and leveled on the front side by a cup grinding disk with rotation of support and grinding disk and slow radial advance. Methods and apparatuses for the surface grinding of a semiconductor wafer are known from U.S. Pat. Nos. 3,905,162 and 5,400,548 or EP-0955126, for example. In this case, a semiconductor wafer is fixedly held on a wafer holder by one of its surfaces, while its opposite surface is processed by means of a grinding disk, by wafer holder and grinding disk rotating and being pressed against one another. In this case, the semiconductor wafer is fixed on the wafer holder in such a way that its center substantially corresponds to the rotation center of the wafer holder. Moreover, the grinding disk is positioned in such a way that the rotation center of the semiconductor wafer reaches a working region or the edge region formed by teeth of the grinding disk. As a result, the entire surface of the semiconductor wafer can be ground without any movement in the grinding plane.

In the case of simultaneous double-side grinding ("double-disk grinding", DDG), the semiconductor wafer is simultaneously processed on both sides in a manner floating freely between two grinding disks mounted on opposite collinear spindles, and in the process is guided in a manner largely free of constraining forces axially between a water cushion (hydrostatic principle) or air cushion (aerostatic principle) acting on the front and rear sides, and is prevented from floating away radially loosely by a surrounding thin guide ring or by individual radial spokes.

In the case of lapping, the semiconductor wafers are moved under a specific pressure with supply of a slurry containing abrasive materials between an upper and a lower working disk, which are usually composed of steel and normally provided with channels for better distribution of the lapping agent, whereby semiconductor material is removed.

DE 103 44 602 A1 and DE 10 2006 032 455 A1 disclose methods for the simultaneous grinding at the same time of both sides of a plurality of semiconductor wafers with a movement sequence similar to that of lapping, but characterized by the fact that abrasive is used which is fixedly bonded in working layers ("films", "pads") applied to the working disks. A method of this type is referred to as "fine grinding with lapping kinematics" or "planetary pad grinding" (PPG).

Working layers which are used in the case of PPG and which are adhesively bonded onto the two working disks are described for example in U.S. Pat. Nos. 6,007,407 A and 6,599,177 B2. During processing, the semiconductor wafers are inserted into thin guide cages, so-called carriers, which have corresponding openings for receiving semiconductor wafers. The carriers have an outer toothing which engages into a rolling apparatus comprising inner and outer toothed rings and are moved by means of said rolling apparatus in the working gap formed between upper and lower working disks.

The edge of the semiconductor wafer including any existing mechanical markings such as an orientation notch is usually processed as well ("edge rounding", "edge notch grinding"). Conventional grinding steps with profiled grinding disks or belt grinding methods with continuous or periodic tool advance are used for this purpose.

These edge rounding methods are necessary since the edge in the unprocessed state is particularly fracture-sensitive and the semiconductor wafer can be damaged even by slight pressure and/or temperature loads in the edge region.

The wafer edge that has been ground and treated with an etching medium is usually polished in a later processing step. In this case, the edge of a centrally rotating semiconductor wafer is pressed against a centrally rotating polishing drum with a specific force (contact pressure). U.S. Pat. No. 5,989,105 discloses an edge polishing method of this type wherein the polishing drum is composed of an aluminum alloy and has a polishing pad applied to it. The semiconductor wafer is usually fixed on a flat wafer holder, a so-called chuck. The edge of the semiconductor wafer projects beyond the chuck, such that it is freely accessible for the polishing drum.

The group of chemical processing steps usually comprises wet-chemical cleaning and/or etching steps.

The group of chemomechanical processing steps comprises polishing steps by which, through in part chemical reaction and in part mechanical material removal (abrasion) the surface is smoothed and residual damage of the surface is removed.

While the polishing methods that work on one side ("single-side polishing") generally lead to poorer plane-parallelisms, polishing methods acting on both sides ("double-side polishing") make it possible to produce semiconductor wafers having improved flatness.

After the grinding, cleaning and etching steps, in accordance with the prior art, the surface of the semiconductor wafers is smoothed by removal polishing. In the case of single-side polishing (SSP), semiconductor wafers are held on the rear side on a support plate by means of cement, by vacuum or by means of adhesion during processing. In the case of double-side polishing (DSP), semiconductor wafers are loosely inserted into a thin toothed disk and polished on the front and rear sides simultaneously in "freely floating" fashion between an upper and a lower polishing plate covered with a polishing pad.

Furthermore, the front sides of the semiconductor wafers are often polished in haze-free fashion, for example by means of a soft polishing pad with the aid of an alkaline polishing sol. This step is often referred to as CMP polishing ("chemomechanical polishing") in the literature. CMP methods are disclosed for example in US 2002-0077039 and in US 2008-0305722.

The prior art likewise discloses the so-called "fixed abrasive polishing" (FAP) technologies, wherein the silicon wafer is polished on a polishing pad which, however, contains an abrasive material bonded in the polishing pad ("fixed-abrasive pad"). A polishing step in which such an FAP polishing pad is used is hereinafter referred to for short as FAP step.

WO 99/55491 A1 describes a two-stage polishing method, comprising a first FAP polishing step and a subsequent second CMP polishing step. In CMP, the polishing pad contains no bonded abrasive material. Here, as in the case of a DSP step, abrasive material is introduced in the form of a slurry between the silicon wafer and the polishing pad. Such a two-stage polishing method is used, in particular, to eliminate scratches left by the FAP step on the polished surface of the substrate.

The German patent application DE 102 007 035 266 A1 describes a method for polishing a substrate composed of silicon material, comprising two polishing steps of the FAP type, which differ in that in one polishing step a polishing agent slurry containing unbonded abrasive material as solid is introduced between the substrate and the polishing pad, while in the second polishing step the polishing agent slurry is replaced by a polishing agent solution that is free of solids.

Semiconductor wafers are often provided with an epitaxial layer, that is to say with a layer grown in monocrystalline fashion and having the same crystal orientation, on which semiconductor components are applied later. Such epitaxially coated semiconductor wafers have certain advantages over semiconductor wafers composed of homogeneous material, for example the prevention of charge reversal in bipolar CMOS circuits followed by the short circuit of the component ("latch-up" problem), lower defect densities (for example reduced number of COPs ("crystal-originated particles") and the absence of an appreciable oxygen content, whereby it is possible to rule out a short-circuit risk owing to oxygen precipitates in component-relevant regions.

What is crucial is how the above-described mechanical and chemomechanical or purely chemical method steps are arranged in a process sequence for producing a semiconductor wafer.

It is known that the polishing steps such as SSP, DSP and CMP, the etching treatments and the epitaxy step lead to a deterioration in the flatness of the semiconductor wafer particularly in the edge region.

Therefore, endeavors have been made in the prior art to minimize the material removal during polishing, in order also to limit the deterioration in flatness to a minimum.

U.S. Pat. No. 5,942,445 A proposes slicing (sawing) a semiconductor wafer from the crystal, rounding the edge of the semiconductor wafer, then carrying out a grinding step, which can comprise a double-side grinding and a single-side grinding of front and rear sides of the semiconductor wafer, subjecting the semiconductor wafer to an alkaline wet etch, and finally polishing the semiconductor wafer by means of DSP. The double-side grinding can also be replaced by a lapping step. A plasma etch can also be effected after the wet etch. Finally, the grinding steps and the wet etch can be replaced by a plasma etch.

The semiconductor wafers polished by means of DSP which are obtainable by this method have an unsatisfactory geometry in the edge region owing to the use of wet-chemical treatments and the plasma-assisted chemical etching (PACE). Thus, at best semiconductor wafers having acceptable flatness values are available if an edge exclusion of at least 2 mm is always taken as a basis, cf. ITRS "Roadmap". The nanotopology, in particular, is adversely influenced by etching methods. In order to improve the nanotopology after the etching step, in DSP an increased material removal is necessary, but the latter in turn adversely influences the geometry in the edge region.

In order to be able to provide semiconductor wafers for future technology generations which meet the stringent requirements made of the edge region of the semiconductor wafer, that is to say in order, for example, to make even the outermost edge region of the wafer accessible to the modern lithographic methods (immersion lithography), other approaches are necessary.

SUMMARY OF THE INVENTION

The problem area described gave rise to an embodiment of the present invention, namely of providing a novel process sequence for producing semiconductor wafers in particular having a diameter of 450 mm.

In an aspect of the present invention of a method for producing a semiconductor wafer comprises:

(a) rounding of the edge of the semiconductor wafer sliced from a single crystal, by means of a grinding disk containing abrasives having an average grain size of 20.0-60.0 µm;

(b) simultaneous double-side material-removing processing of the semiconductor wafer, which lies in freely movable fashion in a cutout in one of a plurality of carriers that are caused to rotate by means of a rolling apparatus, and is thereby moved on a cycloidal trajectory, wherein the semiconductor wafers are processed between two rotating ring-shaped working disks, wherein each working disk comprises a working layer containing abrasives having an average size of 5.0-20.0 µm;

(c) simultaneous double-side material-removing processing of the semiconductor wafer, which lies in freely movable fashion in a cutout in one of a plurality of carriers that are caused to rotate by means of a rolling apparatus, and is thereby moved on a cycloidal trajectory, wherein the semiconductor wafers are processed between two rotating ring-shaped working disks, wherein each working disk comprises a working layer containing abrasives having an average size of 0.5-15.0 µm;

(d) rounding of the edge of the semiconductor wafer by means of a grinding disk containing abrasives having an average grain size of 1.0-20.0 µm;

(e) treatment of both sides of the semiconductor wafer with an etching medium in conjunction with a material removal of not more than 1 µm per side of the semiconductor wafer;

(f) polishing of at least one side of the semiconductor wafer using a polishing pad containing abrasives having a grain size of 0.1-1.0 µm;

(g) polishing of the edge of the semiconductor wafer;

(h) chemical mechanical polishing of at least the front side.

The method according to the invention therefore comprises, in steps (b) and (c), two simultaneous double-side processings of the front and rear sides of the semiconductor wafer, of which the first step provides a coarse grinding and the second step provides a fine grinding and during which the semiconductor wafer lies in the cutout in a carrier in a manner similar to that in the case of lapping and DSP. In addition, with regard to the processing of the surfaces of the semiconductor wafer, at least one FAP polishing and at least one CMP polishing of the front side of the semiconductor wafer are provided.

According to the invention, the method does not contain any mechanical whole-area surface processing during which the semiconductor wafer is fixedly held on one side thereof by means of a wafer holder (e.g. vacuum chuck) while the other side is processed by advancing a rotating grinding disk.

In steps (b) and (c), the semiconductor wafer is processed in a manner free of constraining forces on both sides simultaneously and without fixed clamping onto a mount ("chuck") of the semiconductor wafer, that is to say in "freely floating" fashion.

This has the advantage of avoiding deformation of the semiconductor wafer during "chuck processing". All the removal-relevant surface processing steps have planetary kinematics and whole-area processing of the surfaces of the semiconductor wafer. These methods permit a relatively gentle change in the relative speeds between semiconductor wafer and working disk and also a balanced, uniform wear of the working layers of the working disk.

The method comprises none of the single-side grinding (SSG) processes known in the prior art, neither in the form of coarse grinding nor in the form of fine grinding.

Furthermore, simultaneous double-side grinding (DDG) is also not provided in the method according to the invention.

This leads to the avoidance of defects such as the grinding navel in the center of the semiconductor wafer after SSG and DDG, the "spark-out marks" in the case of DDG and also the grinding marks in the case of SSG, to name just a few.

As is shown later, steps (f) and (h) can also be carried out in a free-floating process divided into two, wherein a conventional double-side polishing machine is used, whereby simultaneous polishing at the same time of both sides of the semiconductor wafer guided in freely floating fashion in a carrier is made possible which combines the conventional DSP and CMP. Therefore, all the chemomechanical or purely mechanical surface processings are effected simultaneously on both sides in a manner free of constraining forces.

BRIEF DESCRIPTION OF THE DRAWING

FIG. 1 shows a flowchart schematically illustrating an embodiment of the method of the present invention.

DETAILED DESCRIPTION

FIG. 1 shows a method 100 for polishing a semiconductor wafer sliced from a single crystal and having an edge and two sides. The edge is rounded using a grinding disk containing abrasives with an average grain size of 20.0-30.0 µm (10). A first simultaneous double-side material-removing process is performed wherein the semiconductor wafers are processed between two rotating ring-shaped working disks, each working disk having a working layer containing abrasives having an average grain size of 5.0-20.0 µm, wherein the semiconductor wafer is placed in a cutout in one of a plurality of carriers rotatable by a rolling apparatus such that the semiconductor wafer lies in a freely movable manner in the carrier and the wafer is movable on a cycloidal trajectory (20). A second simultaneous double-side material-removing process is performed including processing the semiconductor wafers between two rotating ring-shaped working disks, each working disk having a working layer containing abrasives having an average grain size of 0.5-15.0 µm and less than the grain size used in step (b) (30). The edge of the semiconductor wafer is further rounded using a grinding disk containing abraves having an average grain size of 1.0-20.0 µm, wherein the average grain size used is less than the average grain size used in the rounding (40). The two sides are treated with an etching medium together with a material removal of not more than 1 µm per side (50). At least one of the two sides is polished using a polishing pad containing abrasives with an average grain size of 0.1-1.0 µm (60). The edge of the semiconductor wafer is polished (70). At least a front side of the two sides is chemical mechanical polished (80).

Firstly, a semiconductor wafer is sliced from a single crystal composed of semiconductor material, grown by means of CZ or FZ. The semiconductor wafer is preferably sliced by means of a wire saw. The slicing of the semiconductor wafer by means of a wire saw is effected in the manner known e.g. from U.S. Pat. No. 4,655,191, EP 522 542 A1, DE 39 42 671 A1 or EP 433 956 A1.

The grown single crystal composed of semiconductor material is preferably a single crystal composed of silicon. The semiconductor wafer is preferably a monocrystalline silicon wafer.

The method preferably takes place in the specified order in accordance with steps (a) to (h) of the method according to the invention. The edge polishing in accordance with step (g) can take place before or after step (h). It is also preferred to carry out two edge polishing processes, wherein a first edge polishing process takes place between step (f) and step (h) and a second edge polishing process takes place after step (h), wherein the second edge polishing process preferably takes place using a softly removing silica sol (soft edge polishing).

Step (a)—Rounding of the Edge of the Semiconductor Wafer Using Coarse Abrasive

In step (a), the semiconductor wafer is provided with a rounded edge.

For this purpose, the semiconductor wafer is fixed on a rotating table and delivered by its edge against the likewise rotating working surface of a processing tool. The processing tools used in this case can be embodied as disks which are secured to a spindle and have circumferential surfaces serving as working surfaces for processing the edge of the semiconductor wafer.

An apparatus suitable for this purpose is disclosed in DE 195 35 616 A1, for example.

Preferably, the semiconductor wafers are provided with a profile that is symmetrical with respect to the central plane of the wafer, with facets of identical type on the front side of the wafer and the rear side of the wafer or else with an asymmetrical edge profile with different facet widths on the front and rear sides. In this case, the edge of the semiconductor wafer acquires a profile that is geometrically similar to a target profile.

The grinding disk used preferably has a grooved profile. A preferred grinding disk is disclosed in DE 102 006 048 218 A1.

The working surfaces can also be embodied in the form of an abrasive cloth or as an abrasive belt.

The material-removing grain, preferably diamond, can be fixedly anchored in the working surfaces of the processing tools. The grain used has a coarse granulation. According to JIS R 6001:1998, the granulation (in mesh) is #240-#800.

The average grain size is 20-60 μm, preferably 25-40 μm, especially preferably 25-30 μm or 30-40 μm.

Step (b)—Double-Side Material-Removing Processing of the Semiconductor Wafer Sliced from a Single Crystal, Using Coarse Abrasive In step (b) of the method according to the invention, both sides of the semiconductor wafer are subjected to material-removing processing.

PPG is a method for the simultaneous double-side grinding of a plurality of semiconductor wafers, wherein each semiconductor wafer lies in freely movable fashion in a cutout in one of a plurality of carriers that are caused to rotate by means of a rolling apparatus, and is thereby moved on a cycloidal trajectory, wherein the semiconductor wafers are processed in material-removing fashion between two rotating working disks, wherein each working disk comprises a working layer containing bonded abrasive.

A hard material having a Mohs hardness of ≥6 is preferred as abrasive bonded in the working layers. Appropriate abrasive materials are preferably diamond, silicon carbide (SiC), cerium dioxide (CeO2), corundum (aluminum oxide, Al2O3), zirconium dioxide (ZrO2), boron nitride (BN; cubic boron nitride, CBN), furthermore silicon dioxide (SiO2), boron carbide (B4C), through to significantly softer materials such as barium carbonate (BaCO3), calcium carbonate (CaCO3) or magnesium carbonate (MgCO3). Diamond, silicon carbide (SiC) and aluminum oxide (Al2O3; corundum) are particularly preferred, however.

The average grain size of the abrasive is 5-20 μm, preferably 5-15 μm and especially preferably 5-10 μm. The abrasive particles are preferably bonded individually or as clusters in the bonding matrix of the working layer. In the case of cluster bonding, the grain diameters specified as preferred relate to the primary particle size of the cluster constituents.

Working layers with ceramic bonding are preferably used; a synthetic resin bonding is particularly preferred; in the case of working layers with clusters also a hybrid-bonded system (ceramic bonding within the clusters and synthetic resin bonding between clusters and working layer matrix).

That temperature prevailing in the working gap formed between the working layers is preferably kept constant during processing. For this purpose, the carriers can have openings through which cooling lubricant can be exchanged between lower and upper working disks, such that upper and lower working layers always have the same temperature. This counteracts an undesired deformation of the working gap formed between the working layers as a result of the deformation of the working layers or working disks on account of thermal expansion under alternating load. Moreover, the cooling of the abrasives bonded in the working layers is improved and becomes more uniform, and the effective service life thereof is thereby increased.

It is preferred to determine the form of the working gap formed between the working layers during grinding and to alter the form of the working surface of at least one working disk mechanically or thermally depending on the measured geometry of the working gap in such a way that the working gap has a predefined form.

Preferably, the semiconductor wafers temporarily leave the working gap, delimited by the working layers, with a part of their surface during processing, the maximum of the excursion in the radial direction being more than 0% and at most 20% of the diameter of the semiconductor wafer, the excursion being defined as the length—measured relative to the working disks in the radial direction—by which a semiconductor wafer projects beyond the inner or outer edge of the working gap at a specific point in time during grinding.

Preferably, toward the end of processing, a liquid medium having a viscosity of at least 3·10-3 N/m2·s and at most 100·10-3 N/m2·s is introduced between working disks and semiconductor wafers via openings in the carriers. This medium should be present at least while the working disks are being removed from the semiconductor wafer, thereby curbing the mechanical removal by the working layers. Grinding defects that are otherwise observed in the prior art, such as marks, scratches or lift-off marks, can thereby be avoided. This is described in the German Application—not previously published—bearing the file reference 10 2009 048 436.1, to which in its entirety reference is made here.

The following preferably come into consideration as the medium:

aqueous mixture containing polyhydric alcohols (glycerol, monomeric glycols, oligomeric glycols, polyglycols and polyalcohols)

aqueous mixture of glycerol, butanol and a surfactant slurries, wherein the required viscosity of the medium is ensured by the proportion of solids (colloidal dispersions composed of silicon dioxide or cerium oxide particles), preferably with additional viscosity-increasing media (e.g. alcohols) depending on the proportion of solids.

Step (c) Double-Side Material-Removing Processing of the Semiconductor Wafer Sliced from a Single Crystal, Using Finer Abrasive PPG grinding of the semiconductor wafer is likewise effected in step (c), wherein an abrasive cloth having finer granulation than in step (b) is used.

The average grain size of the abrasive is 0.5-10 μm, preferably 0.5-7 μm, particularly preferably 0.5-4 μm, and especially preferably 0.5-2 μm.

The preferred initial thickness prior to processing by means of step (b) of the method according to the invention is 500 to 1000 μm. For silicon wafers having a diameter of 300 mm, an initial thickness of 775 to 950 μm is particularly preferred.

The final thickness of the semiconductor wafers after processing after step (c) of the method according to the invention is preferably 500 to 950 μm, and particularly preferably 775 to 870 μm.

The total removal, that is to say the sum of the individual removals from both sides of the semiconductor wafer, by means of steps (b) and (c) is preferably 7.5 to 120 μm, and particularly preferably 15 to 90 μm.

Step (d) Edge Rounding Using Finer Abrasive

A second edge rounding step takes place in step (d). However, a grinding tool having finer granulation is used.

For this purpose, the semiconductor wafer is once again fixed on a rotating table and delivered by its edge against the likewise rotating work surface of a processing tool. The processing tools used in this case can be embodied as disks which are secured to a spindle and have circumferential surfaces serving as working surfaces for processing the edge of the semiconductor wafer.

The working surfaces can also be embodied in the form of an abrasive cloth or as an abrasive belt.

The material-removing grain, preferably diamond, can be fixedly anchored into the working surfaces of the processing tools.

The grain used has a fine granulation. According to JIS R 6001:1998, the granulation should be finer than #800, preferably #800-#8000.

The average grain size is 0.5-20 µm, preferably 0.5-15 µm, particularly preferably 0.5-10 µm, and especially preferably 0.5-5 µm.

Step (e)—Etching or Cleaning of the Semiconductor Wafer

In step (e) of the method according to the invention, both sides of the semiconductor wafer are treated with an etching medium in conjunction with a material removal of not more than 1 µm per side of the semiconductor wafer.

The minimum material removal per side of the semiconductor wafer is preferably 1 monolayer, that is to say approximately 0.1 nm.

The semiconductor wafer is preferably subjected to a wet-chemical treatment with an acidic medium.

Suitable acidic media include aqueous solutions of hydrofluoric acid, nitric acid or acetic acid.

It is especially preferred for the semiconductor wafer to be treated with a gaseous medium containing hydrogen fluoride and at least one oxidizing agent that oxidizes the surface of the semiconductor wafer. In this case, it is particularly advantageous if the gaseous medium flows against the surfaces of the semiconductor wafer at a relative speed in the range of 40 mm/s to 300 m/s.

The gaseous medium therefore contains hydrogen fluoride and at least one oxidizing agent. The oxidizing agent must be able to oxidize the semiconductor material, e.g. silicon.

When a silicon surface is oxidized, by way of example, a silicon oxide, preferably silicon dioxide arises. This in turn is chemically attacked by hydrogen fluoride, giving rise to hexafluorosilicic acid ($H_2SiF_6$), silicon tetrafluoride ($SiF_4$) and water as reaction products, which are discharged by the stream of the gaseous medium. The gaseous medium can furthermore contain further constituents, for example inert carrier gases such as nitrogen or argon, in order to influence the flow conditions and removal rates.

It is preferred to use at least one oxidizing agent selected from the group consisting of nitrogen dioxide, ozone and chlorine. If pure chlorine is used, it is necessary to add water vapor in order to oxidize the silicon surface. If a mixture of nitrogen dioxide and chlorine and ozone and chlorine is used, the addition of chlorine serves to use the water which is released in the reaction of hydrogen fluoride with silicon dioxide to further oxidize the silicon surface, and thereby to prevent condensation of the water released in the reaction even at low flow velocities and temperatures. It is particularly preferred to use ozone, owing to its high oxidation potential, the fact that the reaction products do not present any problems, and the ease of providing it by means of ozone generators that are in widespread use in the semiconductor industry.

In order to produce the gaseous medium, the constituents can be mixed in the desired quantitative ratio. The ratio of hydrogen fluoride to oxidizing agent is typically chosen in the range of 1:1 to 4:1.

The gaseous medium can be supplied either by the individual components being passed directly into the process chamber or a mixer connected upstream thereof, or by the gaseous oxidizing agent being passed through a liquid aqueous solution of hydrogen fluoride having a suitable concentration. This can take place, for example, in a so-called washing bottle or a comparable apparatus. As the gaseous oxidizing agent passes through the aqueous solution, it is enriched with water and hydrogen fluoride, such that the required gaseous medium arises.

With the same method parameters and a constant ratio of hydrogen fluoride to oxidizing agent, an increase in the temperature and an increase in the concentrations exhibit a reaction-accelerating effect.

The etching in the gas phase serves to reduce the roughness of the semiconductor wafer, whereby the required polishing removal can be reduced, and in addition to remove impurities and reduce surface defects in the crystal structure. The cleaning and etching methods described are preferably effected as single-wafer treatment.

Specifically for a semiconductor wafer having a diameter of 450 mm that is particularly preferred in the context of the method according to the invention, the SSEC 3400 mL from Solid State Equipment Corp./USA, which is designed for substrates up to a size of 500 mm×500 mm, is suitable for this purpose.

Step (f)—FAP Polishing of at Least One Side of the Semiconductor Wafer

In step (f) at least one side of the semiconductor wafer is polished using a polishing pad containing abrasives having an average grain size of 0.1-1.0 µm.

Preferably, front and rear sides of the semiconductor wafer are simultaneously polished at the same time in step (f). Conventional DSP polishing machines are suitable for this purpose, the polishing pads used containing abrasives.

Preferably, only the front side of the semiconductor wafer is polished in step (f).

During the polishing step, a polishing agent solution that is free of solids is preferably introduced between that side of the semiconductor wafer which is to be polished and the polishing pad.

The polishing agent solution is, in the simplest case, water, preferably deionized water (DIW) having the purity customary for use in the semiconductor industry.

However, the polishing agent solution can also contain compounds such as sodium carbonate ($Na_2CO_3$), potassium carbonate ($K_2CO_3$), sodium hydroxide (NaOH), potassium hydroxide (KOH), ammonium hydroxide ($NH_4OH$), tetramethylammonium hydroxide (TMAH) or any desired mixtures thereof. The use of potassium carbonate is especially preferred. In this case, the pH value of the polishing agent solution preferably lies in a range of 10 to 12 and the proportion of the stated compounds in the polishing agent solution is preferably 0.01 to 10% by weight, particularly preferably from 0.01 to 0.2% by weight.

The polishing agent solution can furthermore contain one or more further additives, for example surface-active additives such as wetting agents and surfactants, stabilizers acting as protective colloids, preservatives, biocides, alcohols and complexing agents.

A polishing pad is used which contains an abrasive material bonded in the polishing pad (FAP or FA pad).

Suitable abrasive materials comprise for example particles of oxides of the elements cerium, aluminum, silicon, zirconium and particles of hard materials such as silicon carbide, boron nitride and diamond.

Particularly suitable polishing pads have a surface topography characterized by replicated microstructures. Said microstructures ("posts") have for example the form of columns having a cylindrical or polygonal cross section or the form of pyramids or truncated pyramids.

More detailed descriptions of such polishing pads are contained for example in WO 92/13680 A1 and US 2005/227590 A1.

The use of a polishing pad having cerium oxide abrasives fixedly bonded therein, as described e.g. in U.S. Pat. No. 6,602,117 B1, is especially preferred.

The average particle size of the abrasives is particularly preferably 0.1-0.6 µm.

An average particle size of 0.1-0.25 µm is especially preferred.

Removals of greater than or equal to 1 μm per side are preferably employed for the FA polishing, where in this regard the range of 1-3 μm is particularly preferred and a range of 1.5-2 μm is especially preferably employed.

Preferably, step (f) involves carrying out simultaneous polishing at the same time of the front side of the semiconductor wafer using an FA polishing pad and of the rear side of the semiconductor wafer using a CMP polishing pad. A conventional DSP polishing machine is likewise suitable for this purpose, an FA polishing pad being applied to one polishing plate and a conventional CMP polishing pad being applied to the second polishing plate.

Step (g)—Polishing of the Edge of the Semiconductor Wafer

The edge of the semiconductor wafer is polished in step (g).

Commercially available automatic edge-polishing units are suitable for carrying out step (g) of the method according to the invention.

U.S. Pat. No. 5,989,105 discloses such an apparatus for edge polishing, wherein the polishing drum is composed of an aluminum alloy and has a polishing pad applied to it.

The semiconductor wafer is usually fixed on a flat wafer holder, a so-called chuck. The edge of the semiconductor wafer projects beyond the chuck, such that it is freely accessible for the polishing drum. A centrally rotating polishing drum, to which the polishing pad is applied and which is inclined by a specific angle with respect to the chuck, and the chuck with the semiconductor wafer are delivered to one another and pressed onto one another with a specific contact pressure while the polishing agent is continuously supplied.

During the edge polishing, the chuck with the semiconductor wafer held thereon is rotated centrally.

Preferably, one revolution of the chuck lasts 20-300 s, particularly preferably 50-150 s (revolution time).

A polishing drum, which is covered with the polishing pad and is preferably rotated centrally at a rotational speed of 300-1500 min-1, particularly preferably 500-1000 min-1, and the chuck are delivered to one another, with the polishing drum being set obliquely at a setting angle with respect to the semiconductor wafer and the semiconductor wafer being fixed on the chuck in such a way that it projects slightly beyond the latter and is therefore accessible for the polishing drum.

The setting angle is preferably 30-50°.

Semiconductor wafer and polishing drum are pressed onto one another with a specific contact pressure and with a polishing agent being supplied continuously, preferably with a polishing agent flow rate of 0.1-1 liter/min, particularly preferably 0.15-0.40 liter/min, wherein the contact pressure can be set by means of weights attached to rolls and is preferably 1-5 kg, particularly preferably 2-4 kg.

Polishing drum and semiconductor wafer are preferably moved away from one another after 2-20, particularly preferably after 2-8, revolutions of the semiconductor wafer or of the chuck holding the semiconductor wafer.

In these customary edge polishing methods, the local geometry in the edge region of the semiconductor wafer is usually adversely influenced. This is associated with the fact that with the relatively "soft edge polishing pads" used in this case (relatively soft polishing pads to which silica sol is applied are usually used), not only the edge itself but also an outer part on the front and/or rear side of the semiconductor wafer is polished as well, which can be explained by the hard edge "dipping" into the polishing pad to which polishing agent slurry is applied. This has the effect that removal is indeed effected not only in the region of the actual edge but also in the adjoining region on the front and/or rear side.

Therefore, the edge polishing of the semiconductor wafer in the method according to the invention is preferably effected by fixing the semiconductor wafer on a centrally rotating chuck, delivering the semiconductor wafer and a centrally rotating polishing drum, to which a polishing pad containing fixedly bonded abrasives (FAP polishing pad) is applied and which is inclined with respect to the chuck, and pressing semiconductor wafer and polishing drum onto one another with the continuous supply of a polishing agent solution containing no solids.

This makes it possible to influence the wafer edge in a targeted manner without impairing the adjoining region of front and/or rear side of the semiconductor wafer, and thus for example to set the desired geometry and surface properties only on the wafer edge.

The FAP pad used is significantly harder and much less compressible than the polishing pads used as standard and affords the advantage, moreover, of producing the removal without alkaline-loaded silica sol—e.g. just by using an alkaline solution—, which additionally avoids polishing agent entrainment onto the front side of the wafer and thus the additional adverse influencing of the wafer surface—in the form of e.g. increased defect rates such as e.g. LLS (localized light scatterers) on account of incipient etching.

A short polishing step using softly removing silica sol can additionally follow on the same FAP polishing pad, in order to realize a reduction of the edge roughness and edge defect rates.

The two polishing steps can then be coordinated with one another such that a targeted positive influencing of the wafer edge geometry and surface can be performed without adverse influencing of the wafer partial sites on the wafer front side and wafer rear side.

In principle, therefore, the semiconductor wafer is preferably polished by means of a polishing drum, adhesively bonded on the surface of which is a hard and not very compressible polishing pad comprising fixedly bonded abrasives, with an alkaline solution being supplied.

Preferably, a smoothing step is subsequently effected in a second step on the same polishing pad while a silica sol is supplied, such as e.g. Glanzox 3900* with approximately 1% by weight of SiO2.

*Glanzox 3900 is the product name for a polishing agent slurry offered as a concentrate by Fujimi Incorporated, Japan. The base solution of this concentrate has a pH of 10.5 and contains approximately 9% by weight of colloidal SiO2 having an average particle size of 30 to 40 nm.

It has been found that the impairment of the local geometry in the edge region of the semiconductor wafer as observed in the prior art is entirely avoided by such edge polishing using an FAP pad.

A further advantage is that polishing agent entrainments in the removing step of the edge polishing and thus the occurrence of surface defects on account of uncontrolled incipient etching on the wafer surface are avoided.

The polishing agent solution used during the edge polishing is, in the simplest case, water, preferably deionized water (DIW) having the purity customary for use in the semiconductor industry.

However, the polishing agent solution can also contain compounds such as sodium carbonate (Na2CO3), potassium carbonate (K2CO3), sodium hydroxide (NaOH), potassium hydroxide (KOH), ammonium hydroxide (NH4OH), tetramethylammonium hydroxide (TMAH) or any desired mixtures thereof.

The use of potassium carbonate is especially preferred.

The pH value of the polishing agent solution preferably lies in a range of 10 to 12 and the proportion of the stated compounds in the polishing agent solution is preferably 0.01 to 10% by weight, particularly preferably from 0.01 to 0.2% by weight.

The polishing agent solution can furthermore contain one or more further additives, for example surface-active additives such as wetting agents and surfactants, stabilizers acting as protective colloids, preservatives, biocides, alcohols and complexing agents.

A polishing agent containing abrasives is used in the preferred second step of the edge polishing. This step preferably takes place after step (h), wherein the first edge polishing process takes place between step (f) and step (h).

The proportion of the abrasive material in the polishing agent slurry is preferably 0.25 to 20% by weight, particularly preferably 0.25 to 1% by weight.

The size distribution of the abrasive material particles is preferably markedly monomodal.

The average particle size is 5 to 300 nm, particularly preferably 5 to 50 nm.

The abrasive material comprises a material that mechanically removes the substrate material, preferably one or more of the oxides of the elements aluminum, cerium or silicon.

A polishing agent slurry containing colloidally disperse silica is particularly preferred.

In the optional second step of the edge polishing, in contrast to the first step, preferably no additives such as sodium carbonate (Na2CO3), potassium carbonate (K2CO3), sodium hydroxide (NaOH), potassium hydroxide (KOH), ammonium hydroxide (NH4OH), tetramethylammonium hydroxide (TMAH) are added.

However, the polishing agent slurry can contain one or more further additives, for example surface-active additives such as wetting agents and surfactants, stabilizers acting as protective colloids, preservatives, biocides, alcohols and complexing agents.

Preferably, therefore, a polishing pad containing an abrasive material bonded in the polishing pad (FAP pad or FA pad) is used in step (g) of the method according to the invention.

Suitable abrasive materials comprise for example particles of oxides of the elements cerium, aluminum, silicon, zirconium and particles of hard materials such as silicon carbide, boron nitride and diamond.

Particularly suitable polishing pads have a surface topography characterized by replicated microstructures. Said microstructures ("posts") have for example the form of columns having a cylindrical or polygonal cross section or the form of pyramids or truncated pyramids.

The average particle size of the FAP polishing pad is preferably 0.1-1.0 μm, preferably 0.1-0.6 μm, and particularly preferably 0.1-0.25 μm.

A polishing pad having a multilayered construction comprising a layer containing abrasives, a layer composed of a stiff plastic and also a compliant, non-woven layer, wherein the layers are bonded to one another by means of pressure-sensitive adhesive layers, is particularly suitable for carrying out the method.

The layer composed of a stiff plastic preferably comprises polycarbonate.

The polishing pad can contain an additional layer composed of polyurethane foam.

One of the layers of the polishing pad is compliant in this case.

The compliant layer is preferably a non-woven layer.

The compliant layer preferably comprises polyester fibers. A layer composed of polyester fibers impregnated with polyurethane is particularly suitable ("non-woven").

By means of the compliant layer, the pad height can be adapted and follow continuous transitions.

The compliant layer preferably corresponds to the bottommost layer of the polishing pad. Situated above that there is preferably a foam layer composed of polyurethane, for example, which is fixed on the compliant layer by means of an adhesive layer. Situated above the PU foam is a layer composed of a harder, stiff material, preferably composed of a hard plastic, for which polycarbonate, for example, is suitable. Situated above this stiff layer is the layer having the microreplicated structures, that is to say the actual fixed abrasive layer.

However, the compliant layer can also be situated between the foam layer and the stiff layer or directly below the fixed abrasive layer.

The various layers are fixed to one another preferably by means of pressure-sensitive adhesive layers (PSA).

The polishing pad preferably comprises a layer having the microreplicated structures, a compliant layer and a layer composed of a stiff plastic such as polycarbonate, wherein the compliant layer can be either the middle or the bottommost layer of the polishing pad.

The grain sizes of the multilayered FAP polishing pads used are preferably greater than or equal to 0.1 μm and less than or equal to 1.0 μm, preferably 0.1-0.6 μm, and particularly preferably 0.1-0.25 μm.

Step (h)—Chemical-Mechanical Polishing of at Least the Front Side

CMP polishing of at least the front side of the semiconductor wafer is effected in step (h) of the method.

Preferably, both sides of the semiconductor wafer are polished by means of CMP in this step. A conventional DSP polishing machine is suitable for this purpose, although in said machine softer CMP polishing pads are used instead of the conventional DSP removal polishing pads.

The CMP polishing pads used are polishing pads having a porous matrix.

The polishing pad preferably comprises a thermoplastic or heat-curable polymer. A multiplicity of substances may be envisaged for the material, for example polyurethanes, polycarbonate, polyamide, polyacrylate, polyester, etc.

The polishing pad preferably comprises solid, microporous polyurethane.

It is also preferred to use polishing pads composed of foamed plates or felt or fiber substrates, which are impregnated with polymers.

Coated/impregnated polishing pads can also be configured such that there are a different pore distribution and different pore sizes in the substrate than in the coating.

The polishing pads can be substantially flat or else perforated.

In order to control the porosity of the polishing pad, fillers can be introduced into the polishing pad.

Commercially available polishing pads are, for example, the SPM 3100 from Rodel Inc. or the pads of the DCP series and the pads of the IC1000™, Polytex™ or SUBA™ brands from Rohm & Haas.

Preferably, step (h) involves carrying out simultaneous polishing at the same time of the rear side of the semiconductor wafer using an FA polishing pad, that is to say a polishing pad comprising fixedly bonded abrasives, and of the front side of the semiconductor wafer using a CMP polishing pad (without abrasive). A conventional DSP polishing machine is likewise suitable for this purpose, e.g. a machine of the AC2000 type from Peter Wolters, Rendsburg (Germany), an FA polishing pad being applied to one polishing plate and a conventional CMP polishing pad being applied to the second polishing plate.

In this case, steps (f) and (h) provide a combined simultaneous double-side polishing process by virtue of the fact that FAP polishing and CMP polishing take place simultaneously first on the front side/rear side and then on the rear side/front side.

The conventional DSP step and the subsequent separate CMP step are dispensed with.

The polishing machine AC2000 from Peter Wolters, Rendsburg (Germany), is equipped with pin interlocking of the outer and inner rings in order to drive the carriers. The apparatus can be designed for one or more carriers. Owing to the higher throughput, an apparatus for a plurality of carriers is preferred, such as is described for example in DE-100 07 390 A1 and in which the carriers move on a planetary path around the center of the apparatus. The apparatus includes a lower and an upper polishing plate, which are freely rotatable horizontally and are covered with a polishing pad. During the polishing, the semiconductor wafers are situated in the cutouts in the carriers and between the two polishing plates, which rotate and exert a specific polishing pressure on them while a polishing agent is continuously supplied. In this case, the carriers are also set in motion, preferably by means of rotating pin rings which engage in teeth on the circumference of the carriers.

A typical carrier comprises cutouts for receiving three semiconductor wafers. Situated on the circumference of the cutouts are inlays which are intended to protect the fracture-sensitive edges of the semiconductor wafers, in particular including against metals being released from the carrier body. The carrier body can comprise for example metal, ceramic, plastic, fiber-reinforced plastic, or metal coated with plastic or with a diamond-like carbon layer (DLC layer). Steels are preferred, however, stainless chromium steel being particularly preferred. The cutouts are preferably designed for receiving an odd number of semiconductor wafers having a diameter of at least 200 mm, preferably 300 mm, especially preferably 450 mm, and thicknesses of 500 to 1000 µm.

A polishing agent slurry containing abrasives is supplied during the combined simultaneous double-side polishing (FAP+CMP).

The size distribution of the abrasive material particles is preferably markedly monomodal.

The average particle size is 5 to 300 nm, particularly preferably 5 to 50 nm.

The abrasive material comprises a material that mechanically removes the substrate material, preferably one or more of the oxides of the elements aluminum, cerium or silicon.

The proportion of the abrasive material in the polishing agent slurry is preferably 0.25 to 20% by weight, particularly preferably 0.25 to 1% by weight.

The use of colloidally disperse silica as polishing agent slurry is particularly preferred.

The aqueous polishing agents Levasil® 200 from Bayer AG and Glanzox 3900® from Fujimi are used, by way of example.

The polishing agent preferably contains additives such as sodium carbonate ($Na_2CO_3$), potassium carbonate ($K_2CO_3$), sodium hydroxide (NaOH), potassium hydroxide (KOH), ammonium hydroxide ($NH_4OH$), tetramethylammonium hydroxide (TMAH).

However, the polishing agent slurry can contain one or more further additives, for example surface-active additives such as wetting agents and surfactants, stabilizers acting as protective colloids, preservatives, biocides, alcohols and complexing agents.

The FAP polishing pad used preferably has the properties described under (f).

Preferably, after step (h), renewed edge polishing is effected, especially preferably as fine polishing using a softer polishing pad than in step (g) or using a polishing pad comprising even finer abrasives than the FA polishing pad described in step (g).

Embodiments

Embodiments A-E of the method according to the invention are presented below. The abbreviations PPG, DDG, FAP and CMP used, have been explained above. The ending_coarse means that abrasives (grinding disk, working layers), having coarse granulation are used, while abrasives having finer granulation are used in steps having the ending_fine. The abrasives used during edge rounding and during PPG and the preferred grain sizes have been explained above. Edge polishing_fine denotes soft edge polishing using softly removing silica sol.

Embodiment A

Slicing a wafer from the single crystal—edge rounding_coarse—PPG_coarse—PPG_fine—edge rounding_fine—etching—FAP of front and rear sides of the semiconductor wafer—edge polishing—CMP of the front side Embodiment B Slicing a wafer from the single crystal—edge rounding_coarse—PPG_coarse—PPG_fine—edge rounding_fine—etching—FAP of front and rear sides of the semiconductor wafer—edge polishing—CMP of the front and rear sides of the semiconductor wafer Embodiment C Slicing a wafer from the single crystal—edge rounding_coarse—PPG_coarse—PPG_fine—edge rounding_fine—etching—FAP of the front side and simultaneously CMP of the rear side—FAP of rear side and simultaneously CMP of the front side—edge polishing Embodiment D Slicing a wafer from the single crystal—edge rounding_coarse—PPG_coarse—PPG_fine—edge rounding_fine—etching—FAP of the front side and simultaneously CMP of the rear side—edge polishing—FAP of rear side and simultaneously CMP of front side—edge polishing_fine Embodiment E Slicing a wafer from the single crystal—edge rounding_coarse—PPG_coarse—PPG_fine—edge rounding_fine—etching—FAP of the front side and simultaneously CMP of the rear side—edge polishing—FAP of rear side and simultaneously CMP of front side.

What is claimed is:

1. A method for producing a semiconductor wafer sliced from a single crystal and having an edge and two sides, the method comprising:
   (a) rounding the edge using a grinding disk containing abrasives with an average grain size of 20.0-60.0 µm;
   (b) performing a coarse PPG process for simultaneous double-side material removal wherein the semiconductor wafers are whole-area processed between two rotating ring-shaped working disks, each rotating ring-shaped working disk having a working layer containing abrasives having an average grain size of 5.0-20.0 µm and a Mohs hardness of ≥6, wherein the semiconductor wafer is placed in a cutout in one of a plurality of carriers rotatable by a rolling apparatus such that the semiconductor wafer lies in a freely movable manner in the carrier and the semiconductor wafer is movable on a cycloidal trajectory;

(c) performing a fine PPG process for simultaneous double-side material removal that includes whole area processing of the semiconductor wafers between two rotating ring-shaped working disks, each rotating ring-shaped working disk having a working layer containing abrasives having an average grain size of 0.5-15.0 μm and less than the average grain size used in step (b);

(d) further rounding the edge of the semiconductor wafer using a grinding disk containing abrasives having an average grain size of 1.0 -20.0 μm, wherein the average grain size used is less than the average grain size used in the rounding in step (a);

(e) treating the two sides with an etching medium together with a further material removal of not more than 1 μm per side;

(f) polishing at least one of the two sides using a polishing pad containing abrasives with an average grain size of 0.1-1.0 μm;

(g) polishing the edge of the semiconductor wafer; and (h) chemical mechanical polishing (CMP) of at least a front side of the two sides.

2. The method as recited in claim 1, wherein the polishing of the at least one of the two sides of step (f) includes polishing the front side using a polishing pad with fixedly bonded abrasives, and wherein the chemical mechanical polishing includes chemical mechanical polishing a rear side during the polishing the front side.

3. The method as recited in claim 1, wherein the polishing of the at least one of the two sides is performed during the chemical mechanical polishing of step (h) and includes polishing the front side using a polishing pad with fixedly bonded abrasives.

4. The method as recited in claim 1, wherein the abrasives of the polishing pad used in step (f) include at least one particle selected from the group consisting of silicon carbide, boron nitride, diamond, cerium oxide, aluminum oxide, silicon oxide and zirconium oxide.

5. The method as recited in claim 1, wherein the further material removal in step (e) is at least 0.1 nm and at most 1 μm.

6. The method as recited in claim 1, wherein the polishing the edge of step (g) includes:

centrally rotating the semiconductor wafer;

continuously supplying a polishing agent solution containing no solids; and pressing the edge with a specific force against a centrally rotating polishing drum having a polishing pad, the polishing pad containing fixedly bonded abrasive particles selected from the group consisting of silicon carbide, boron nitride, diamond and oxides of the elements cerium, aluminum, silicon and zirconium.

7. The method as recited in claim 1, wherein the average grain size of the abrasives of the grinding disk used in step (a) is one of 25-30 μm and 30-40 μm.

8. The method as recited in claim 1, wherein the performing a first simultaneous double-side material-removing process of step (b) includes using two working disks having an average grain size of 5-10 μm, 9. The method as recited in claim 1, wherein the performing a second simultaneous double-side material-removing process of step (c) includes using two working disks having an average grain size of 0.5-4 μm.

10. The method as recited in claim 1, wherein the average grain size of the abrasives of the grinding disk used in step (a) is one of 0.5-10 μm.

* * * * *